United States Patent
Yang et al.

(10) Patent No.: US 9,016,236 B2
(45) Date of Patent: Apr. 28, 2015

(54) METHOD AND APPARATUS FOR ANGULAR HIGH DENSITY PLASMA CHEMICAL VAPOR DEPOSITION

(75) Inventors: Daewon Yang, Hopewell Junction, NY (US); Kangguo Cheng, Guilderland, NY (US); Pavel Smetana, Poughkeepsie, NY (US); Richard S. Wise, Newburgh, NY (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 1749 days.

(21) Appl. No.: 12/185,339

(22) Filed: Aug. 4, 2008

(65) Prior Publication Data

US 2010/0029082 A1 Feb. 4, 2010

(51) Int. Cl.
| | |
|---|---|
| *H01L 21/306* | (2006.01) |
| *C23C 16/00* | (2006.01) |
| *C23C 16/507* | (2006.01) |
| *C23C 16/34* | (2006.01) |
| *C23C 16/40* | (2006.01) |
| *C23C 16/455* | (2006.01) |
| *C23C 16/458* | (2006.01) |
| *C23C 16/56* | (2006.01) |
| *H01J 37/20* | (2006.01) |
| *H01J 37/32* | (2006.01) |
| *H01L 27/108* | (2006.01) |
| *H01L 21/316* | (2006.01) |
| *H01L 21/318* | (2006.01) |

(52) U.S. Cl.
CPC .............. *C23C 16/507* (2013.01); *C23C 16/345* (2013.01); *C23C 16/402* (2013.01); *C23C 16/45578* (2013.01); *C23C 16/4586* (2013.01); *C23C 16/56* (2013.01); *H01J 37/20* (2013.01); *H01J 37/321* (2013.01); *H01J 2237/20207* (2013.01); *H01J 2237/3323* (2013.01); *H01L 21/31608* (2013.01); *H01L 21/3185* (2013.01); *H01L 27/10867* (2013.01)

(58) Field of Classification Search
CPC H01J 37/321; H01J 37/3211; H01J 37/32119
USPC ........... 118/723 I, 723 IR, 723 AN, 728, 729, 118/730; 156/345.48, 345.49, 345.51, 156/345.54; 315/111.51
See application file for complete search history.

(56) References Cited

U.S. PATENT DOCUMENTS

| | | | | |
|---|---|---|---|---|
| 4,990,229 | A | * | 2/1991 | Campbell et al. ......... 204/298.06 |
| 5,759,282 | A | * | 6/1998 | Yang .............................. 118/729 |
| 5,783,457 | A | | 7/1998 | Hsu |
| 5,789,298 | A | | 8/1998 | Gardner et al. |
| 5,855,725 | A | * | 1/1999 | Sakai ........................ 156/345.49 |
| 5,865,896 | A | * | 2/1999 | Nowak et al. ............... 118/723 I |
| 5,897,713 | A | * | 4/1999 | Tomioka et al. ............ 118/723 I |

(Continued)

*Primary Examiner* — Luz Alejandro Mulero
(74) *Attorney, Agent, or Firm* — Joseph P. Abate; Howard M. Cohn (57) ABSTRACT

A high-density plasma chemical vapor deposition tool and the method for use of the tool is disclosed. The chemical vapor deposition tool allows for angular adjustment of the pedestal that holds the substrate being manufactured. Electromagnets serve as an "electron filter" that allows for angular deposition of material onto the substrate. Methods for fabrication of trench structures and asymmetrical spacers in a semiconductor manufacturing process are also disclosed. The angular deposition saves process steps, thereby reducing time, complexity, and cost of manufacture, while improving overall product yield.

2 Claims, 7 Drawing Sheets

(56) References Cited

U.S. PATENT DOCUMENTS

| | | | |
|---|---|---|---|
| 5,897,740 A * | 4/1999 | Tamura | 156/345.48 |
| 5,923,982 A | 7/1999 | Kadosh et al. | |
| 5,985,724 A | 11/1999 | Kadosh et al. | |
| 6,158,384 A * | 12/2000 | Ye et al. | 118/723 I |
| 6,168,999 B1 | 1/2001 | Xiang et al. | |
| 6,218,251 B1 | 4/2001 | Kadosh et al. | |
| 6,310,577 B1 * | 10/2001 | Ra | 343/701 |
| 6,426,526 B1 | 7/2002 | Divakaruni et al. | |
| 6,488,807 B1 * | 12/2002 | Collins et al. | 156/345.49 |
| 6,498,061 B2 | 12/2002 | Divakaruni et al. | |
| 6,573,137 B1 | 6/2003 | Divakaruni et al. | |
| 6,794,256 B1 | 9/2004 | Fuselier et al. | |
| 6,872,629 B2 | 3/2005 | Hsiao et al. | |
| 7,019,350 B2 | 3/2006 | Hsu | |
| 7,078,307 B2 | 7/2006 | Lin et al. | |
| 2004/0244694 A1 * | 12/2004 | Hayashi | 118/728 |
| 2005/0006556 A1 * | 1/2005 | Floyd et al. | 248/566 |
| 2008/0026488 A1 | 1/2008 | Panda et al. | |

* cited by examiner

METHOD AND APPARATUS FOR ANGULAR HIGH DENSITY PLASMA CHEMICAL VAPOR DEPOSITION

FIELD OF THE INVENTION

The present invention generally relates to the fields of semiconductor fabrication and, more particularly, to high-density plasma (HDP) chemical vapor deposition (CVD) apparatuses and methods of forming semiconductor devices using the same.

BACKGROUND OF THE INVENTION

In general, semiconductor manufacturing comprises multiple process steps. As semiconductor integrated circuits (ICs) have continued to increase in complexity, the number of metallization levels, and number of devices on a chip have increased in like manner. Various features within a particular chip often require multiple steps to build. For example, in some cases, multiple lithography, deposition, and planarization steps are required. Each process step adds cost and complexity to the manufacturing process, and may adversely affect overall product yield. It is therefore desirable to reduce the number of process steps required to fabricate a given semiconductor IC.

Features commonly found in semiconductor devices include asymmetric spacers, and buried straps. Asymmetric spacers are used for various functions during semiconductor device manufacturing. For example, if differential offsets are needed for disparate doping requirements of source or drain areas near a gate structure, oftentimes asymmetric spacers are utilized to accomplish this offset. A commonly employed technique for the formation of asymmetric spacers utilizes multiple gate structure sidewall insulator layers and multiple implantations with numerous photoresist masking and etching processes to produce the desired offset. This technique is time-consuming, and the multiple masking and etching steps add to the manufacturing costs accordingly.

Dynamic random-access memory (DRAM) cells are composed of two main components, a storage capacitor that is used to stores electronic charge and an access transistor that is used to transfer the electronic charge to and from the storage capacitor. The storage capacitor may be either planar on the surface of the semiconductor substrate or trench etched into the semiconductor substrate. In the semiconductor industry where there is an increased demand for memory storage capacity accompanied with an ever decreasing chip size, the trench storage capacitor layout is favored over the planar storage capacitor design because this particular setup results in a dramatic reduction in the space required for the capacitor without sacrificing capacitance.

A very important element in the DRAM cell is the electrical connection made between the trench storage capacitor and the access transistor. Such a contact is often referred to in the art as a buried strap formed at the intersection of one electrode of the storage trench capacitor and one source/drain junction of the access transistor.

As the asymmetric spacer and buried strap involve multiple process steps, it is therefore desirable to have an improved method and apparatus for fabrication of these elements, to improve the speed and quality of manufacture for these devices.

SUMMARY OF THE INVENTION

The present invention provides a chemical vapor deposition apparatus, comprising: a chamber, the chamber being comprised of a base section and a dome, and the dome being comprised of an upper portion and a lower portion;
an induction coil that is disposed around the upper portion of the dome;
a column located within the chamber;
a pedestal disposed on the column, wherein the pedestal is configured and disposed to adjustably tilt on said column;
a plurality of gas injectors that are configured and disposed to inject gas within said chamber;
a plurality of electromagnets disposed around the lower portion of the dome, the plurality of electromagnets configured and disposed to create a magnetic field within the chamber;
a first frequency source connected to the induction coil; and
a second frequency source that is connected to the pedestal.

The present invention further provides a chemical vapor deposition apparatus in which the pedestal is connected to a plurality of linkage rods, wherein each linkage rod is configured and disposed to move independently in a vertical direction, thereby providing an adjustable tilt of the pedestal.

The present invention further provides a chemical vapor deposition apparatus in which the plurality of linkage rods is two linkage rods.

The present invention further provides a chemical vapor deposition apparatus in which the dome is comprised of a ceramic material.

The present invention further provides a chemical vapor deposition apparatus in which the first frequency source operates at a frequency in the range of about 380 kilohertz to about 420 kilohertz.

The present invention further provides a chemical vapor deposition apparatus in which the second frequency source operates at a frequency in the range of about 13 megahertz to about 14 megahertz.

The present invention further provides a chemical vapor deposition apparatus in which the plurality of electromagnets are configured to generate a magnetic field in the range of about 40 gauss to about 100 gauss.

The present invention further provides a chemical vapor deposition apparatus in which the pedestal is configured to tilt at an angle ranging from about 0 degrees to about 60 degrees.

The present invention also provides a method for fabricating a trench structure in a semiconductor, the method comprising:
providing a semiconductor substrate having at least one trench structure formed therein;
positioning the substrate within an angular deposition tool, wherein the substrate is positioned at an angle with respect to the deposition direction;
performing a deposition of spacer material with the substrate at that angle, thereby causing a deposition of spacer material to form on one side of the trench structure; and
performing an etch, thereby removing excess spacer material, and forming a spacer.

The present invention further provides a method for fabricating a trench structure in a semiconductor in which the step of positioning the substrate at an angle comprises positioning the substrate at an angle ranging from about 10 degrees to about 60 degrees The present invention further provides a method for fabricating a trench structure in a semiconductor in which the step of performing an etch comprises performing a reactive ion etch.

The present invention further provides a method for fabricating a trench structure in a semiconductor in which the step of performing a deposition of spacer material comprises performing a deposition of silicon oxide.

The present invention further provides a method for fabricating a trench structure in a semiconductor in which the step of performing a deposition of spacer material comprises performing a deposition of silicon nitride.

The present invention also provides a method for fabricating an asymmetrical spacer on a transistor in a semiconductor, the method comprising:

providing a semiconductor substrate having at least one transistor formed thereon, the transistor comprising a gate;

positioning the substrate within an angular deposition tool, wherein the substrate is positioned at an angle with respect to the deposition direction;

performing a deposition of spacer material with the substrate at said angle, thereby causing more spacer material to be deposited on one side of the gate;

performing an etch, thereby removing excess spacer material, and forming an asymmetrical spacer comprised of a small spacer and a large spacer.

The present invention further provides a method for fabricating an asymmetrical spacer on a transistor in a semiconductor, in which the step of positioning the substrate at an angle comprises positioning the substrate at an angle ranging from about 10 degrees to about 60 degrees.

The present invention further provides a method for fabricating an asymmetrical spacer on a transistor in a semiconductor, in which the step of performing an etch comprises performing a reactive ion etch.

The present invention further provides a method for fabricating an asymmetrical spacer on a transistor in a semiconductor, in which the step of performing a deposition of spacer material comprises performing a deposition of silicon oxide.

The present invention further provides a method for fabricating an asymmetrical spacer on a transistor in a semiconductor, which further comprises the step of performing a second etch, whereby the second etch removes the small spacer.

The present invention further provides a method for fabricating an asymmetrical spacer on a transistor in a semiconductor, in which the step of performing a second etch comprises performing an isotropic etch.

The present invention further provides a method for fabricating an asymmetrical spacer on a transistor in a semiconductor, in which the step of performing an isotropic etch comprises performing a wet etch.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity. Block diagrams may not illustrate certain connections that are not critical to the implementation or operation of the present invention, for illustrative clarity.

In the drawings accompanying the description that follows, often both reference numerals and legends (labels, text descriptions) may be used to identify elements. If legends are provided, they are intended merely as an aid to the reader, and should not in any way be interpreted as limiting.

Often, similar elements may be referred to by similar numbers in various figures (FIGs) of the drawing, in which case typically the last two significant digits may be the same, the most significant digit being the number of the drawing figure (FIG).

DETAILED DESCRIPTION OF THE INVENTION

Figure 1:
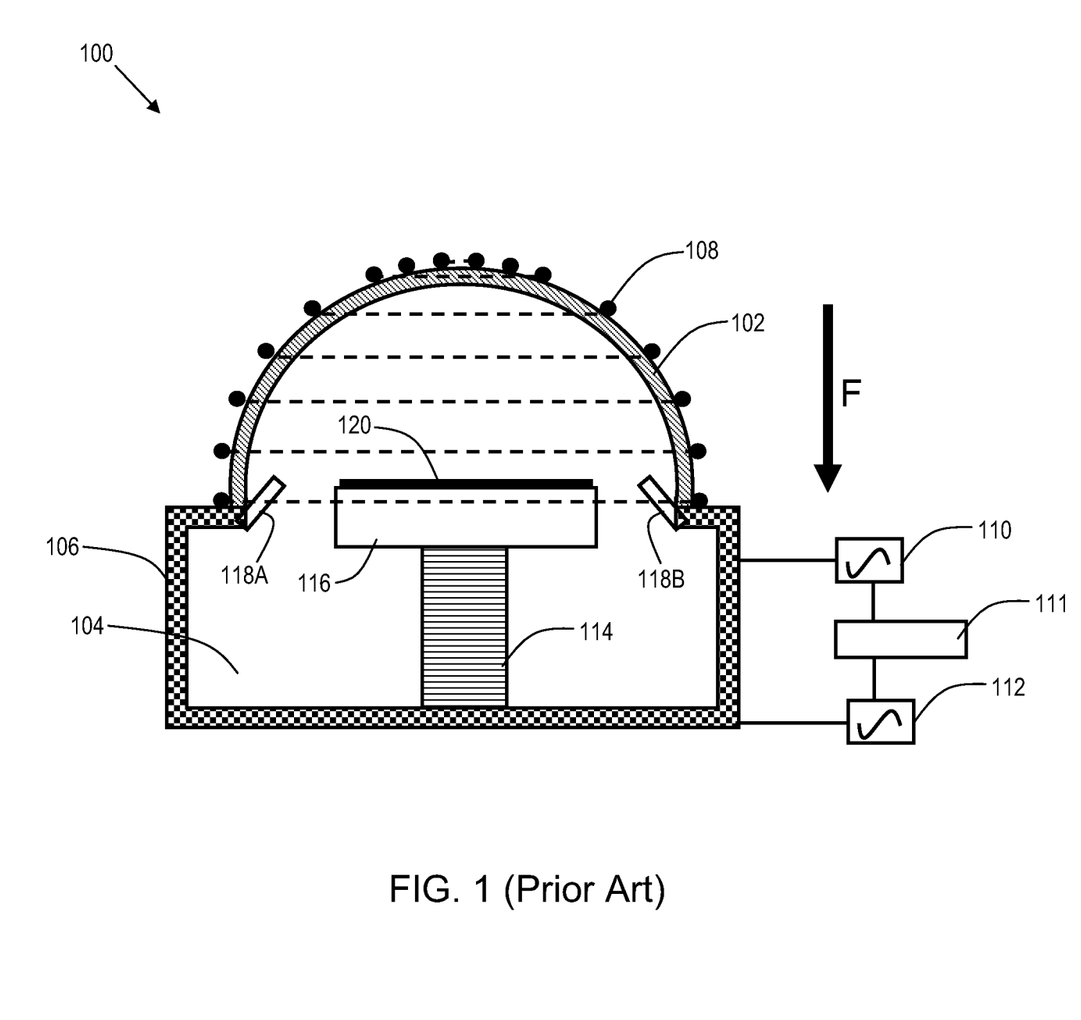
FIG. 1 shows a prior art plasma chemical vapor deposition (CVD) tool.

FIG. 1 shows a prior art plasma chemical vapor deposition (CVD) tool 100. The prior art method will be briefly reviewed here to provide context for discussion of the present invention. Tool 100 comprises a chamber 104. The chamber is comprised of a base section, which is formed by chamber walls 106, and a dome 102. Dome 102 may be comprised of a ceramic material. Disposed around dome 102 is induction coil 108. A column 114 supports a pedestal 116. Pedestal 116 serves to support workpiece 120. Workpiece 120 is typically a semiconductor wafer comprising a plurality of die undergoing fabrication. Pedestal 116 also serves as an electrode in the deposition process. A plurality of gas injectors (shown as 118A and 118B) inject a gas into chamber 104. Frequency source 110 provides a frequency (typically around 400 KHz) that creates a magnetic flux in the chamber 104, in a downward direction (as indicated by arrow F). Frequency source 112 provides a frequency (typically around 13.56 MHz) that is connected to the pedestal 116. Controller 111 comprises one or more computer systems that control the deposition parameters, such as frequency of frequency sources 110 and 112, activation ad deactivation of the induction coil 108, and the flow of gas via gas ports 118A and 118B.

Figure 2:
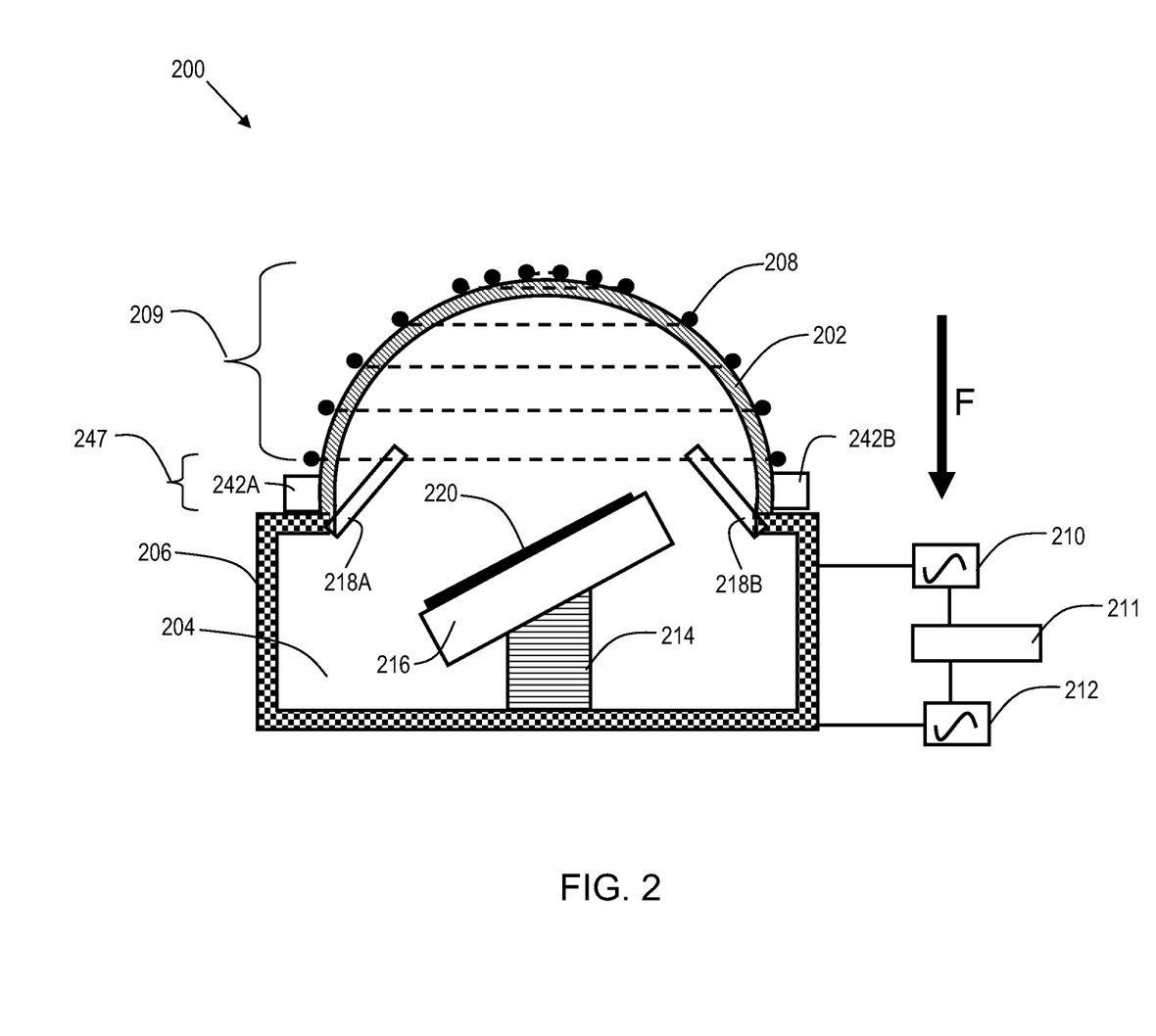
FIG. 2 shows a plasma CVD tool in accordance with the present invention.

FIG. 2 shows a plasma CVD tool 200 in accordance with the present invention. Tool 200 comprises a chamber 204. The chamber is comprised of a base section, which is formed by chamber walls 206, and a dome 202. Disposed around dome 202 is induction coil 208.

Unlike the prior art device described in FIG. 1, the coil 208 of the present invention does not extend as far to the base of the dome 202. The part of the dome 202 covered by induction coil 208 is referred to as the upper portion of the dome, as indicated by reference 209. A plurality of electromagnets (shown as 242A and 242B, and referred to in general as 242) are disposed around the lower portion of the dome 202. While the number of electromagnets used can vary, in practice, it is anticipated that anywhere from 1 to 4 electromagnets would be sufficient to provide the necessary electron filtering, as will be further explained in a later paragraph. The lower portion is indicated by reference 247. The electromagnets are current controlled by controller 211.

A column 214 supports a pedestal 216. Pedestal 216 serves to support workpiece 220. Pedestal 216 also serves as an electrode in the deposition process. Unlike the prior art apparatus described in FIG. 1, the pedestal 216 of plasma CVD tool 200 has an adjustable tilt. A plurality of gas injectors (shown as 218A and 218B) inject a gas into chamber 204. The gas that is used will vary, depending on the application. For example, for a deposition of a silicon oxide film, the gas may be one of SiH4, O2, He, H2, and Ar. For deposition of a silicon nitride film, the gas may be one of SiH4, N2, and Ar. Note that other suitable gasses may be used, without departing from the scope of the present invention. Note that while only two gas injectors (218A and 218B) are shown, there are preferably about 40 similar gas injectors disposed around the interior of chamber 204 in a similar manner. The gas injectors will be generally referred to as 218. A difference between the gas injectors 218 of CVD tool 200, and gas injectors 118 of CVD tool 100 is that gas injectors 218 are sufficiently long to extend into the upper portion 209 of dome 202.

Frequency source 210 provides a frequency (typically around 400 KHz) that creates a magnetic flux in the chamber 204, in a downward direction (as indicated by arrow F). Frequency source 212 provides a frequency (typically around 13.56 MHz) that is connected to the pedestal 216. Controller 211 comprises one or more computer systems that control the deposition parameters, such as frequency of frequency sources 210 and 212, activation and deactivation of the induction coil 208, activation and control of electromagnets 242, and the flow of gas via gas injectors 218.

The role of the electromagnets 242 is to filter electrons away from the area contained within the lower portion 247 of dome 202. Without the electron filtering, the deposited material will still be deposited perpendicular to the surface of workpiece 220 even though it is tilted. This is because of the physics of non-equilibrium plasma. Without the electromagnets, the high mobility electrons are extracted first from the adjacent plasma (forming the so-called "sheath"), and setup an opposing electric field that accelerates ions in a normal direction towards the wafer surface. By preventing electron flux to the surface of the wafer, no sheath will be created, and the ion flux will flow in the direction determined by the applied electric field, in the present case off-normal to the wafer surface.

The electromagnets, by removing the electrons from the area contained within the lower portion 247 of dome 202, facilitate "off-normal" (non-perpendicular) ion bombardment, and allow the tilt of pedestal 216 to determine the deposition angle. The electromagnets 242 are preferably configured to generate a magnetic field in the range of about 40 gauss to about 100 gauss.

Figure 3:
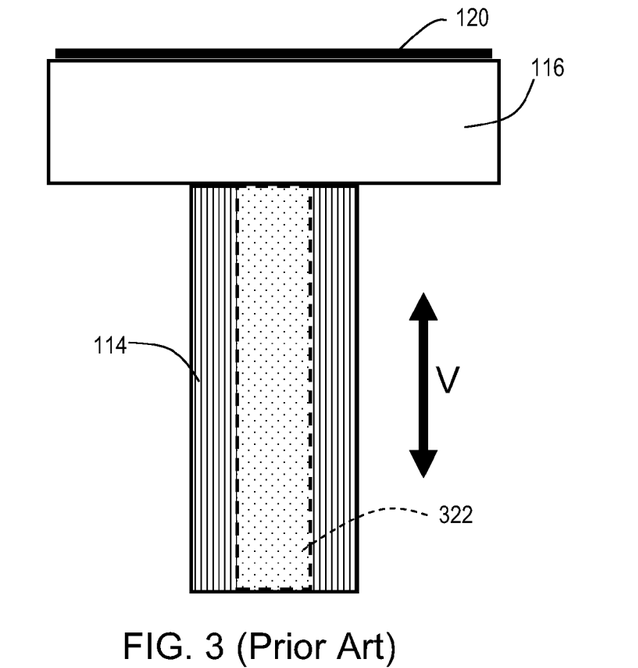
FIG. 3 shows a prior art pedestal of a plasma CVD tool.

FIG. 3 shows additional detail of the pedestal 120 of plasma CVD tool 100. In this view, the column 114 is shown in cross-section. Rod 322 within column 114 travels in a vertical direction (indicated by V) to raise or lower pedestal 116.

Figure 4:
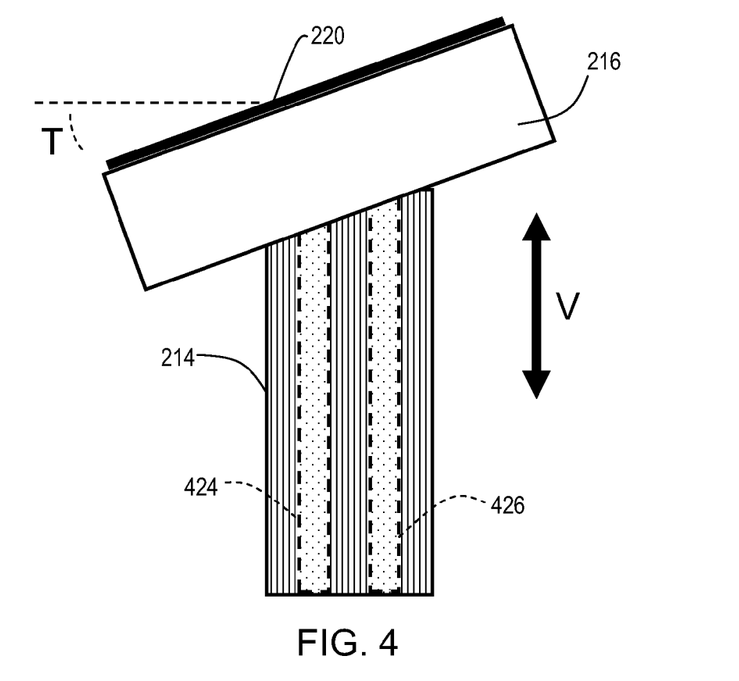
FIG. 4 shows a pedestal of a plasma CVD tool in accordance with the present invention.

FIG. 4 shows a pedestal 216 of plasma CVD tool 200, in accordance with the present invention. In this view, the column 214 is shown in cross-section. Linkage rods 424 and 426 are able to travel in the vertical direction (indicated by arrow V) independently of each other. This facilitates the establishment of angle T, which is the angle at which deposited material will be applied to workpiece 220. Angle T is preferably variable up to about 60 degrees. The angle T may be programmed as part of a recipe for the manufacture of a particular semiconductor. It is contemplated that the angle T will normally be set somewhere in between 10 degrees and 60 degrees.

Note that while two linkage rods are illustrated here, it is possible to have more linkage rods, without departing from the scope of the present invention. Furthermore, it is also possible to use another mechanical system to provide the means to adjustably tilt pedestal 216. For example, a mechanical linkage connected to a high-precision stepper motor with an angular encoder may also be used, without departing from the scope of the present invention.

As will be elaborated on in upcoming description, the ability to perform angular deposition provides for some novel semiconductor fabrication methods that save time and cost, while improving product yield.

Figure 5A:
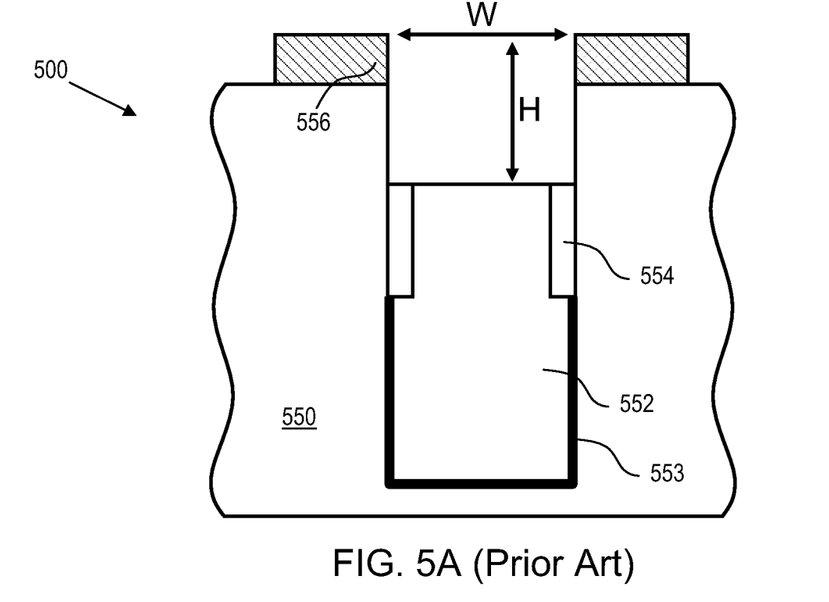
FIGS. 5A-5D illustrate the formation of a trench structure, in accordance with the present invention.

FIGS. 5A-5D illustrate the formation of a trench structure 500, in accordance with the present invention. FIG. 5A shows the starting point for the method of the present invention. Trench structure 500 is comprised of conductive region 552, a node dielectric layer 553, dielectric collar 554, and pad layer 556. The trench is formed on a semiconductor substrate 550 (bulk or SOI (semiconductor-on-insulator) substrate). The substrate may comprise silicon, silicon germanium, germanium, or any other semiconductor materials. The substrate surrounding the trench may be doped. The conductive region 552, node dielectric layer 553, and the substrate 550 form a capacitor. the conductive region 552 may comprise doped silicon, germanium, silicon germanium, a metal (e.g., titanium), and/or a metallic compound material (e.g., TiN). The node dielectric layer 553 may comprise silicon oxide, silicon nitride, silicon oxynitride, and/or a high-k material (e.g., hafnium oxide). It is desired to form a single-sides spacer within trench structure 500 in order to complete the fabrication process. The method of the present invention utilizes angular deposition to perform the next step of the fabrication process. The angle used may be derived by considering the geometry of the structure to which angular deposition is to be applied. For example, with a trench width W that is 100 nanometers wide, and a trench depth H (from the top of the trench to the start of polysilicon region 552) that is also 100 nanometers deep, then the angle may be selected by:

$$\tan^{-1}(W/H) \text{ FIG.}$$

Figure 5B:
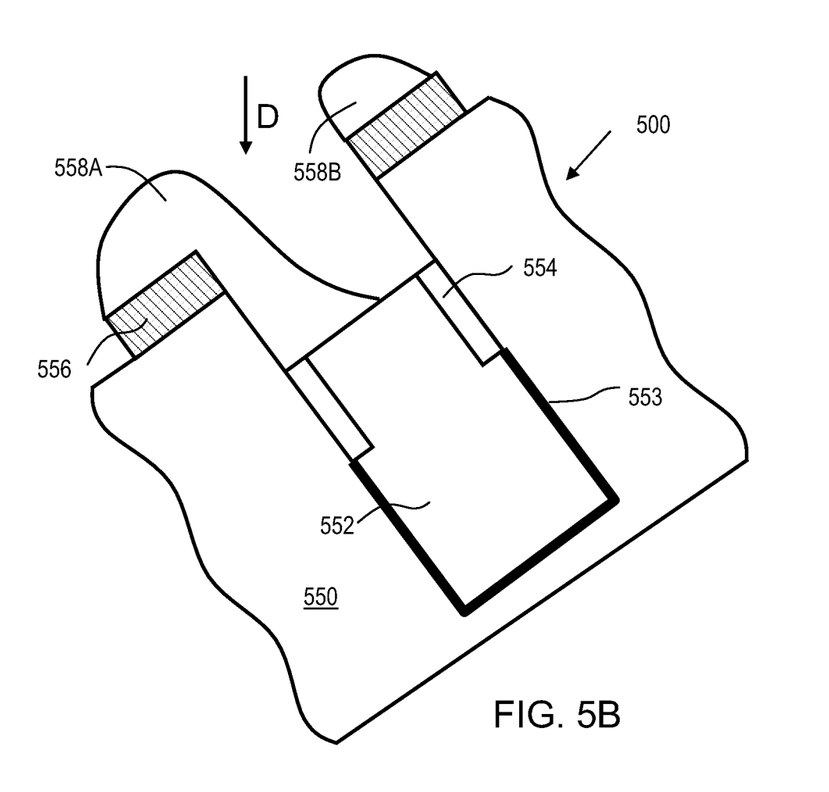

5B shows angular deposition of spacer material, such as an oxide layer or nitride layer. In practice, the deposited material may include, but is not limited to, SiO2, nitride, or oxynitride. The typical thickness ranges for the deposited layer are preferably in the range of about 10 nanometers to about 100 nanometers, more preferably, from about 15 nanometers to about 50 nanometers, and most preferably, from about 15 nanometers to about 30 nanometers.

The layer is formed by an angular deposition tool such as that which is described in this disclosure. The oxide is deposited in deposition direction D onto the trench structure 500. Due to the angle of the trench structure 500 during deposition, two oxide regions are formed (558A and 558B). Depending on how precise the deposition is, there might be some oxide (not shown), which is thinner than 558A and 558B, deposited on the opposite side of trench sidewall. In that case, a timed etch can be performed to completely remove the thinner oxide and to leave oxide in 558A and 558B regions.

Figure 5C:
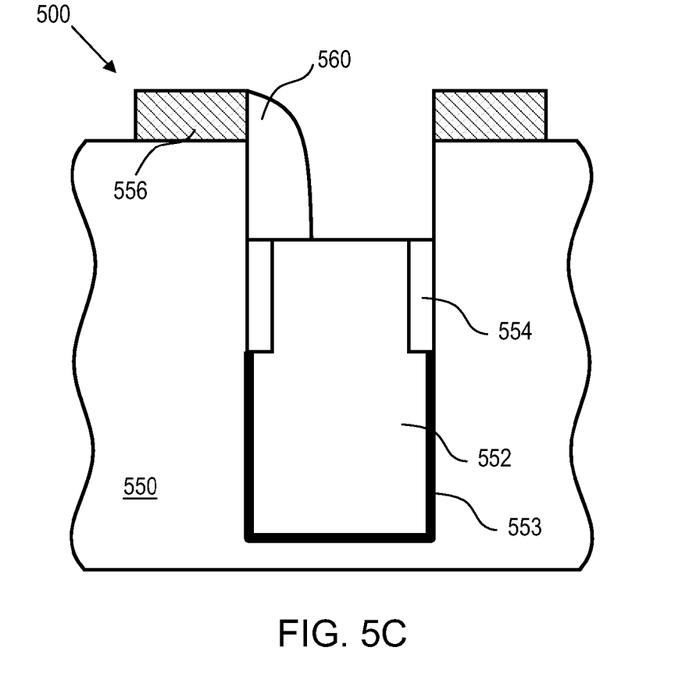

FIG. 5C shows the trench structure 500 after an etch is performed to remove excess oxide. In particular, region 558B is removed, and oxide region 558A is reduced, to form spacer 560. In one embodiment, the etch is performed via a reactive ion etch process.

Figure 5D:
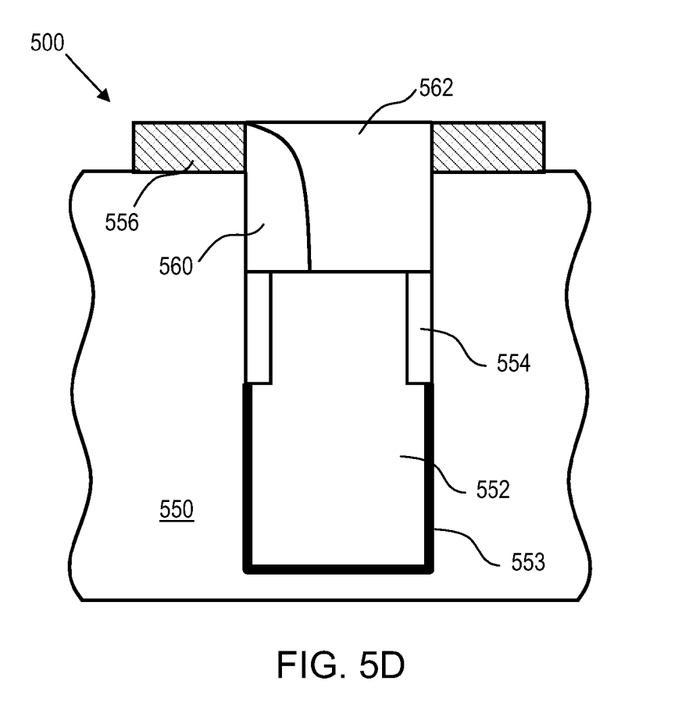
Figure 6A:
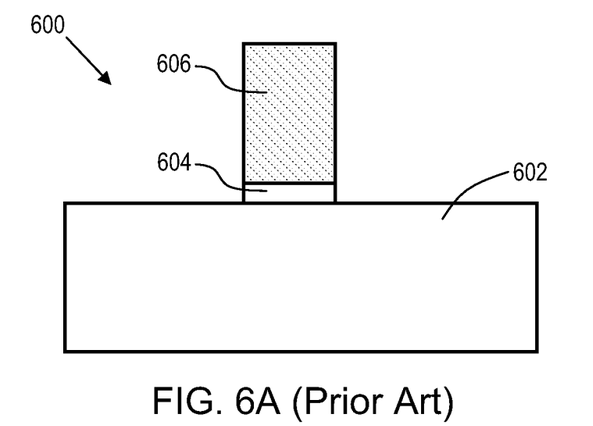
FIGS. 6A-6C illustrate the formation of an asymmetrical spacer, in accordance with the present invention.
Figure 6B:
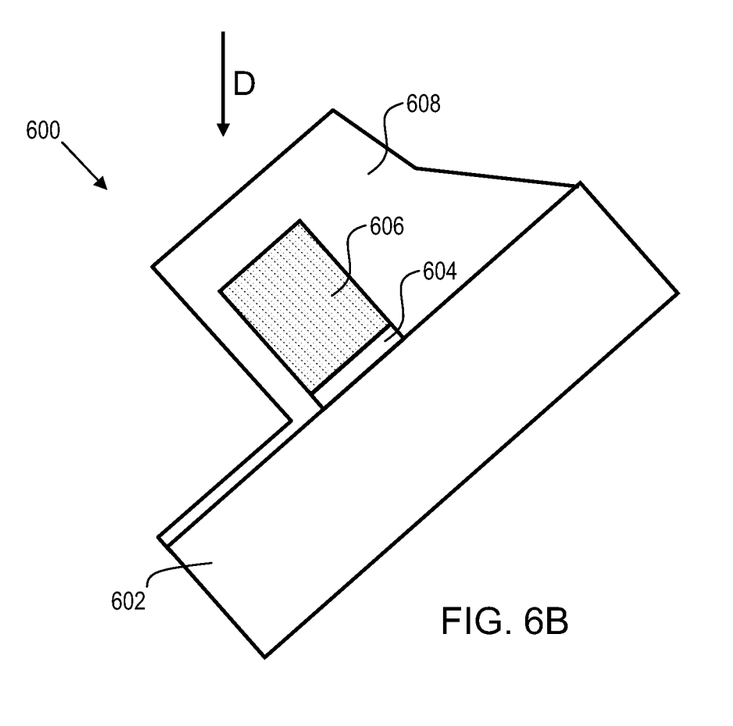
Figure 6C:
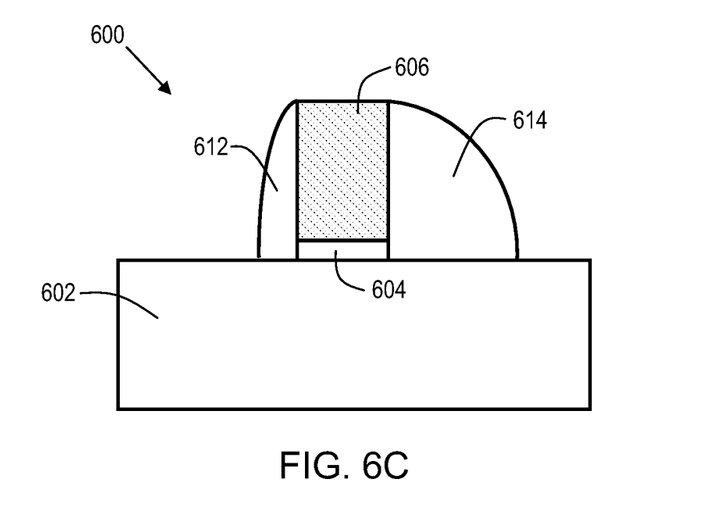

Finally, in FIG. 5D, an additional polysilicon deposition is performed to complete the trench structure 500, forming what is known as a "single-sided strap." This structure has applications in a variety of semiconductor devices, such as DRAM, for example. FIGS. 6A-6C illustrate the formation of an asymmetrical spacer, in accordance with the present invention. FIG. 6A shows the starting point for the method of the present invention. Transistor 600 is comprised of silicon substrate 602, gate 606, and gate dielectric 604 disposed between substrate 602 and gate 606. Gate 606 may be comprised of polysilicon, metal, and/or a metallic compound. Gate dielectric 604 may be comprised of silicon oxide, silicon nitride, silicon oxynitride, and/or so-called high-k material. Other suitable materials may be used without departing from the scope of the present invention.

FIG. 6B shows angular deposition of layer 608. Note that while layer 608 is being referred to as an oxide layer during this description, the present invention can also be practiced using other materials for layer 608. In addition to oxide, layer 608 can also be nitride or oxynitride, for example.

The oxide layer 608 is formed by an angular deposition tool such as that which is described in this disclosure. The oxide layer 608 is deposited in direction D onto the transistor 600. Due to the angle of the transistor 600 during deposition, the oxide layer is asymmetrical about gate 606, having more oxide on one side, and less oxide on the other side of gate 606.

FIG. 6C shows the transistor 600 after an etch is performed to reduce oxide layer 608 to form small spacer 612, and large spacer 614. In one embodiment, the etch is performed via a reactive ion etch process. Since spacers 612 and 614 are of different sizes, the overall spacer structure is referred to as an "asymmetrical spacer," which is comprised of small spacer 612, and large spacer 614. In prior art methods, forming the asymmetrical spacer requires multiple patterning and etching steps. This adds cost, complexity, and time to the manufacturing process. With the method of the present invention, the angular deposition allows formation of an asymmetrical spacer with a reduction in the number of process steps. That is, instead of using a mask and/or selective etching to form the asymmetrical spacer, the present method actually deposits the spacer material (oxide) in an asymmetrical manner to start with, and some process steps are eliminated.

Figure 7:
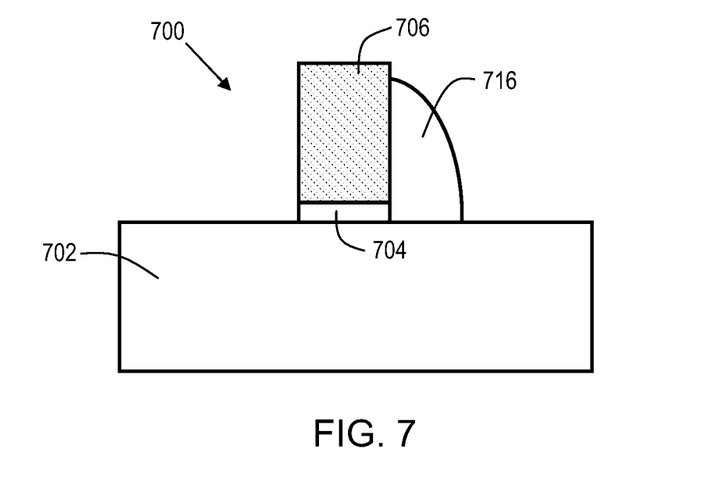
FIG. 7 illustrates a single-sided spacer, in accordance with the present invention.

FIG. 7 shows an optional embodiment of transistor 700. This embodiment is formed by further etching of a transistor 600 as shown in FIG. 6C, until spacer 612 is removed. This etching is preferably isotropic, and may be performed via a wet etch. The result is that only one spacer 716 remains on the transistor 700. The single spacer transistor has various applications in semiconductor devices, such as a tunneling field effect transistor (tunnel FET) and impact ionization FET, to name a few.

It is a fairly common practice that the layout of a semiconductor die is such that all devices (e.g. transistors, trench capacitors, etc. . . . ) are oriented in the same way. However, the present invention can be used even when this is not the case, by utilization of a non-critical mask to protect the areas of the die that are not to undergo angular deposition.

As can now be appreciated, the present invention improves the semiconductor manufacturing process. This is accomplished by providing a novel deposition tool that allows for angular adjustment of the pedestal that holds the substrate. A plurality of electromagnets serve as an "electron filter" that allows for angular deposition of material onto the substrate. Methods for fabrication of trench structures and asymmetrical spacers are also disclosed. The angular deposition saves process steps, thereby reducing time, complexity, and cost of manufacture, while improving overall product yield.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A chemical vapor deposition apparatus, comprising:
a chamber, said chamber comprised of a base section;
a dome, wherein the dome is disposed on the chamber, and wherein said dome is comprised of an upper portion and a lower portion;
an induction coil; said induction coil disposed around the upper portion of said dome, wherein the portion of the dome with said coil disposed around it is the upper portion of the dome and the portion of the dome below the upper portion of the dome is the lower portion of the dome;
a column located within said chamber;
a pedestal disposed on said column, wherein said pedestal is configured and disposed to adjustably tilt on said column, and wherein the pedestal is disposed in the chamber, below the induction coil;
a plurality of gas injectors, said plurality of gas injectors configured and disposed to inject gas in the upper portion of the dome within said chamber;
a plurality of electromagnets disposed only around the lower portion of said dome, said plurality of electromagnets configured and disposed to perform electron filtering within said chamber, wherein each gas injector of the plurality of gas injectors extends above the plurality of electromagnets, whereby electrons contained within the lower portion of the dome are filtered away, thereby preventing formation of a sheath;
a first frequency source, said first frequency source connected to said induction coil; and
a second frequency source, said second frequency source connected to said pedestal;
wherein the first frequency source is configured and disposed to create a magnetic flux in the chamber at an angle to the pedestal, thereby facilitating an angular deposition and, wherein the pedestal is connected to a plurality of linkage rods, wherein each linkage rod is configured and disposed to move independently in a vertical direction, thereby providing an adjustable tilt of the pedestal in order to create an asymmetrical deposition.

2. The apparatus of claim 1, wherein the plurality of linkage rods is two linkage rods.

* * * * *